(12) United States Patent
Sato et al.

(10) Patent No.: US 6,599,845 B2
(45) Date of Patent: Jul. 29, 2003

(54) OXIDIZING METHOD AND OXIDATION SYSTEM

(75) Inventors: Shoichi Sato, Nirasaki (JP); Kazuhide Hasebe, Nirasaki (JP); Kota Umezawa, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 36 days.

(21) Appl. No.: 09/845,345

(22) Filed: May 1, 2001

(65) Prior Publication Data
US 2002/0127873 A1 Sep. 12, 2002

(30) Foreign Application Priority Data

| May 2, 2000 | (JP) | ............................ 2000-133255 |
|---|---|---|
| May 26, 2000 | (JP) | ............................ 2000-157005 |
| Sep. 27, 2000 | (JP) | ............................ 2000-295111 |

(51) Int. Cl.[7] ..................... H01L 21/31; H01L 21/469
(52) U.S. Cl. ............................. 438/770; 438/773
(58) Field of Search ................. 438/694, 735, 438/738, 769, 770, 773, 787

(56) References Cited

U.S. PATENT DOCUMENTS

| 5,620,932 A | * | 4/1997 | Fujimaki ................. 438/770 |
|---|---|---|---|
| 5,648,282 A | * | 7/1997 | Yoneda ................... 438/305 |
| 5,976,618 A | * | 11/1999 | Fukuyama et al. ......... 427/226 |
| 6,037,273 A | | 3/2000 | Gronet et al. ............. 438/773 |
| 6,159,866 A | | 12/2000 | Gronet et al. ............. 438/769 |
| 6,239,044 B1 | * | 5/2001 | Kashiwagi et al. ........ 438/787 |

FOREIGN PATENT DOCUMENTS

| JP | 2001-274154 | 10/2001 |
|---|---|---|
| WO | WO 99/03141 | 1/1999 |

* cited by examiner

Primary Examiner—Kamand Cuneo
Assistant Examiner—Asok Kumar Sarkar
(74) Attorney, Agent, or Firm—Smith, Gambrell & Russell, LLP

(57) ABSTRACT

An oxidation method of oxidizing surfaces of workpieces heated at a predetermined temperature in a vacuum atmosphere in a processing vessel produces active hydroxyl and active oxygen species. The active hydroxyl and active oxygen species oxidize the surfaces of the workpieces in a processing vessel. Both the intrafilm thickness uniformity and the characteristics of the oxide film can be improved, maintaining oxidation rate on a relatively high level.

10 Claims, 8 Drawing Sheets

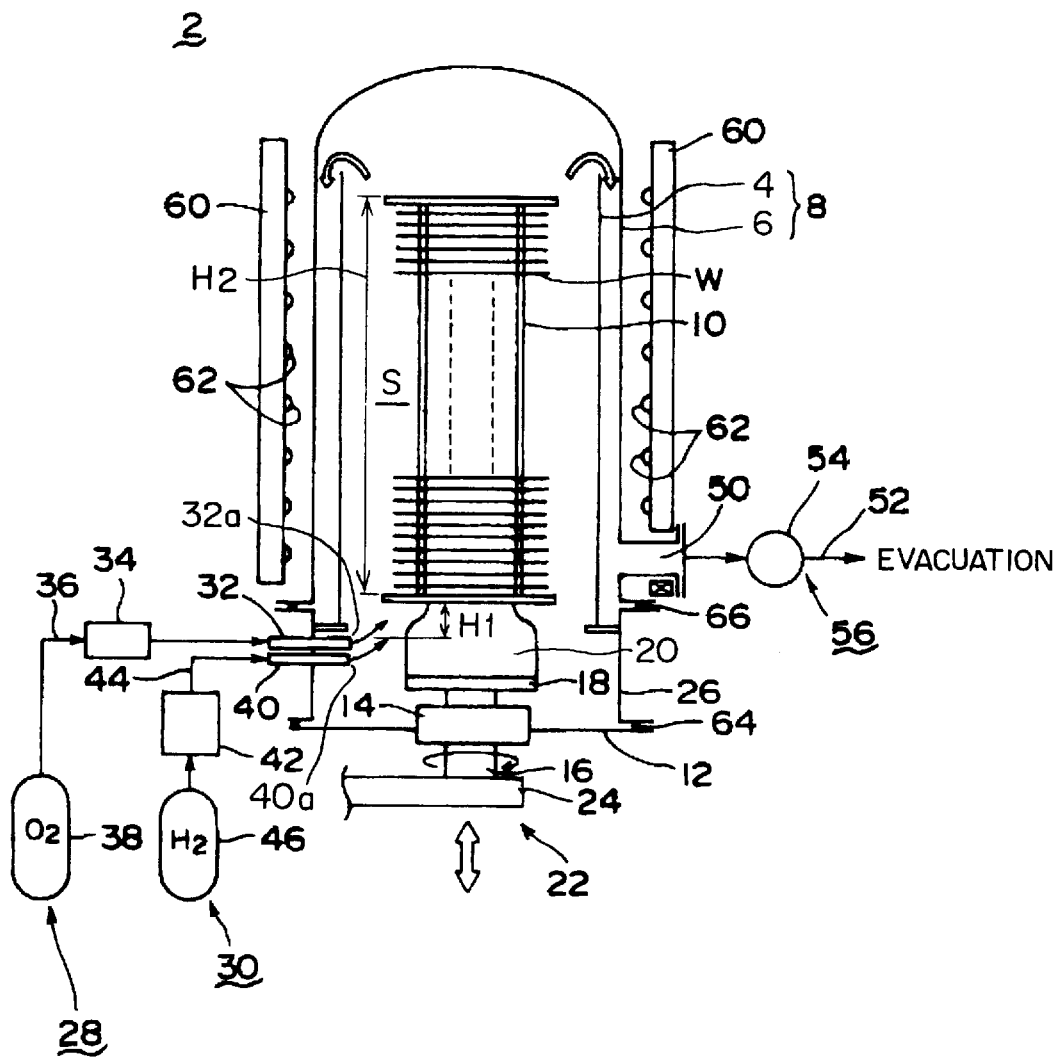
F I G. 1

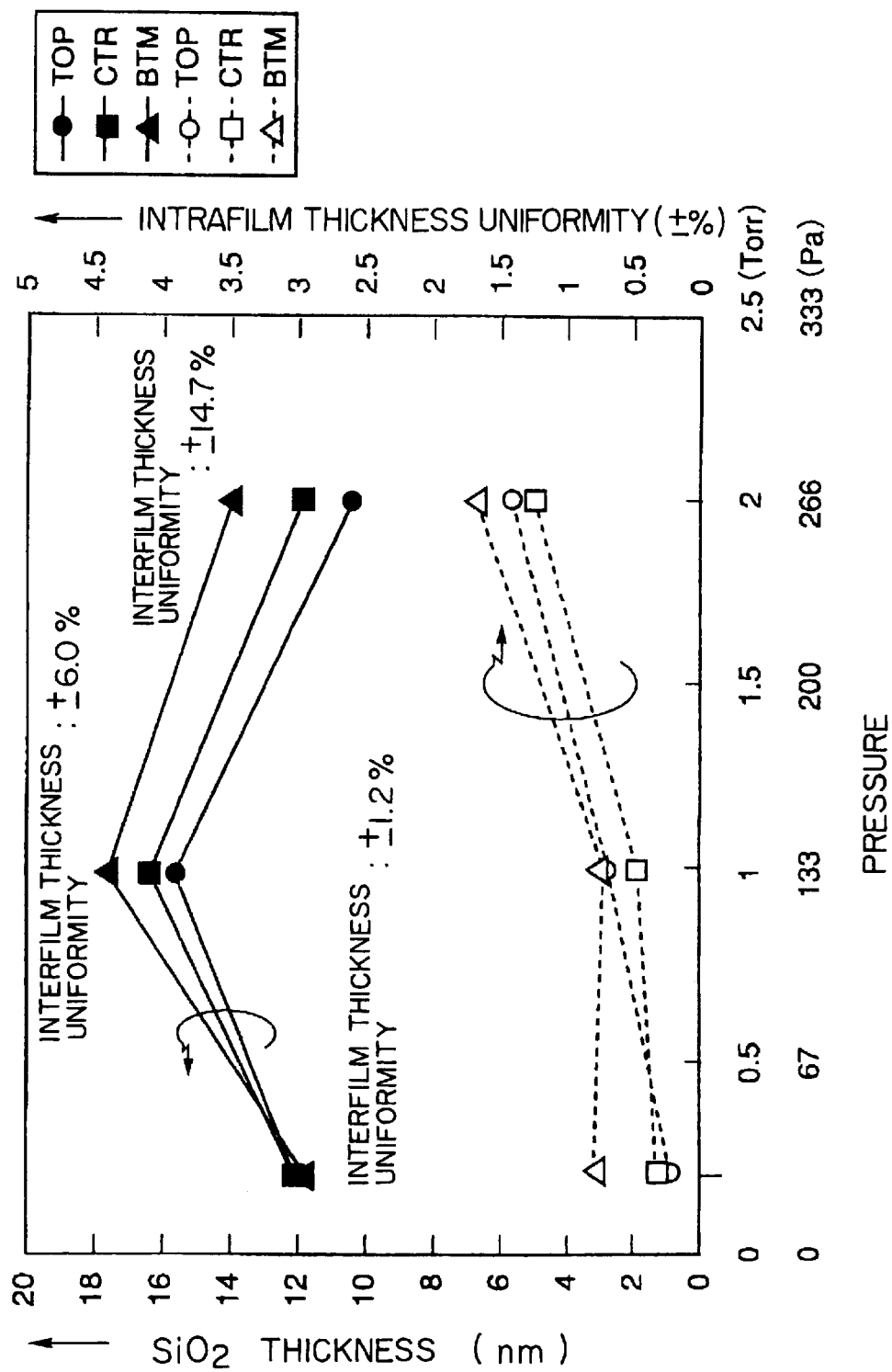
F I G. 5

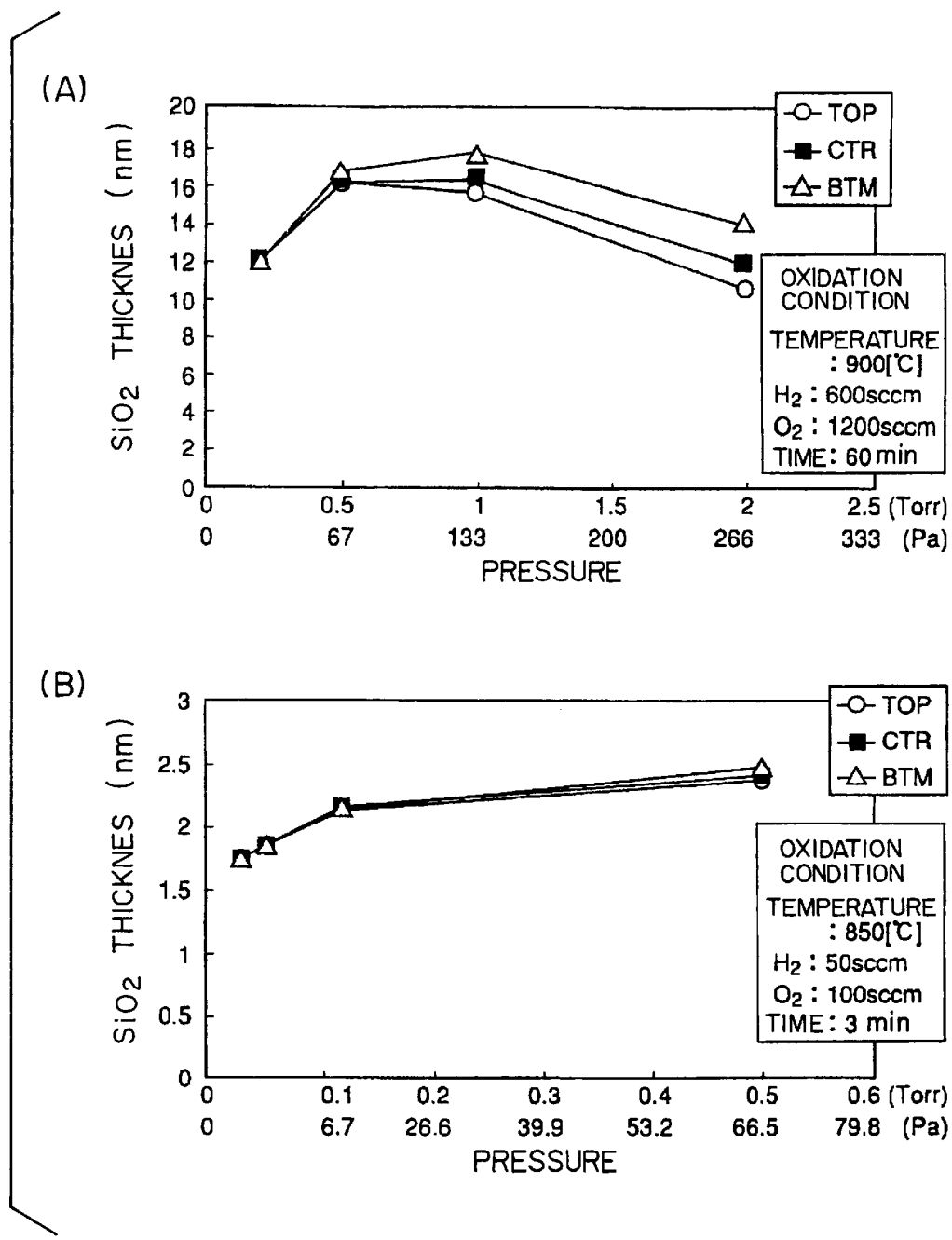
F I G. 6

OXIDIZING METHOD AND OXIDATION SYSTEM

TECHNICAL FIELD

The present invention relates to an oxidation method of oxidizing surfaces of workpieces, such as semiconductor wafers, and an oxidation system.

BACKGROUND ART

Generally, a semiconductor wafer, such as a silicon substrate, is subjected to various processes including a film forming process, an etching process, an oxidation process, a diffusion process and a modification process when fabricating a semiconductor integrated circuit. For example, the oxidation process among those processes is used for oxidizing a surface of a single-crystal silicon film or a polysilicon film and for oxidizing a metal film. The oxidation process is used mainly for forming gate oxide films and insulating films for capacitors.

Oxidation methods are classified by pressure into atmospheric pressure oxidation methods that are carried out in an atmospheric atmosphere and vacuum oxidation methods that are carried out in a vacuum atmosphere. Oxidation methods are classified by oxidizing gas into wet oxidation methods including a wet oxidation method disclosed in, for example, JP-A No. Hei 3-140453, that use steam generated by burning hydrogen in an oxygen atmosphere in an external combustor, and dry oxidation methods including a dry oxidation method disclosed in, for example, JP-A No. Sho 57-1232 that supply only ozone or oxygen into a processing vessel.

In view of quality and characteristics including dielectric strength, corrosion resistance and reliability, an insulating film formed by a dry oxidation process is superior to that formed by a wet oxidation process. In view of deposition rate and uniformity, generally, an oxide film (insulating film) formed by an atmospheric oxidation process is satisfactory in oxidation rate but the same is not satisfactory in the intrafilm thickness uniformity of an oxide layer formed on the surface of the wafer. On the other hand, an oxide film formed by a vacuum oxidation process is satisfactory in the intrafilm thickness uniformity of the oxide layer but the same is not satisfactory in oxidation rate.

Design rules that have been hitherto applied to designing semiconductor integrated circuits have not been very severe the aforesaid various oxidation methods have been selectively used taking into consideration purposes of oxide films, process conditions and equipment costs. However, line width and film thickness have been progressively decreased and severer design rules have been applied to designing semiconductor integrated circuits in recent years, and design rules requires higher film characteristics and higher intrafilm thickness uniformity of films. The conventional oxidation methods are unable to meet such requirements satisfactorily.

A wet oxidation system disclosed in, for example, JP-A No. Hei 4-18727 supplies $H_2$ gas and $O_2$ gas individually into a lower region in a vertical quartz processing vessel, burns the $H_2$ gas in a combustion space defined in a quartz cap to produce steam, makes the steam flow upward along a row of wafers to accomplish an oxidation process.

Since this prior art oxidation system burns $H_2$ gas in the combustion space, a lower end region in the processing vessel has a high steam concentration, the steam is consumed as the same flows upward and an upper end region in the processing vessel has an excessively low steam concentration. Accordingly, the thickness of an oxide film formed on the surface of the wafer is greatly dependent on the position where the wafer is held for the oxidation process and, in some cases, the intrafilm thickness uniformity of the oxide film is deteriorated.

Another oxidation system disclosed in, for example, JP-A No. Sho 57-1232 arranges a plurality of wafers in a horizontal batch-processing reaction tube, supplies $O_2$ gas or supplies $O_2$ gas and $H_2$ gas simultaneously through one of the opposite ends of the reaction tube into the reaction tube., and forms an oxide film in a vacuum atmosphere.

However, since this prior art oxidation system forms a film in an atmosphere of a relatively high pressure by a hydrogen burning oxidation method, steam is a principal element of reaction, an upper region with respect to the flowing direction of gases in the processing vessel and a lower region in the processing vessel differ excessively from each other in steam concentration and hence it is possible that the intrafilm thickness uniformity of the oxide film is deteriorated.

A third oxidation system disclosed in, for example, U.S. Pat. No. 6,037,273 supplies $O_2$ gas and $H_2$ gas into the processing chamber of a wafer-fed processing vessel provided with a lamp heating device, makes the $O_2$ gas and the $H_2$ gas interact in the vicinity of the surface of a semiconductor wafer placed in the processing chamber to produce steam, and forms an oxide film by oxidizing the surface of the wafer with the steam.

However, this oxidation system supplies $O_2$ gas and $H_2$ gas through gas inlets spaced a short distance in the range of 20 to 30 mm from the wafer into the processing chamber, makes the $O_2$ gas and the $H_2$ gas interact in the vicinity of the surface of the semiconductor wafer to produce steam, and forms the oxide film in an atmosphere of a relatively high process pressure. Thus, it is possible that the intrafilm thickness uniformity of the film is deteriorated.

DISCLOSURE OF THE INVENTION

The present invention has been made to solve the aforesaid problems effectively. Accordingly, it is an object of the present invention to provide an oxidation method and an oxidation system capable of improving the intrafilm thickness uniformity of the oxide film and the interfilm thickness uniformity of oxide films and the characteristics of oxide films, maintaining oxidation rate on a relatively high level.

According to the present invention, an oxidation method of oxidizing surfaces of workpieces heated at a predetermined temperature in a vacuum atmosphere created within a processing vessel comprises the steps of: producing active hydroxyl species and active oxygen species; and oxidizing the surfaces of the workpieces by the active hydroxyl and the active oxygen species.

In the oxidation method according to the present invention, an oxidative gas and a reductive gas are supplied into the processing vessel by separate gas supply systems, respectively, in the step of producing active hydroxyl and active oxygen species.

In the oxidation method according to the present invention, the processing vessel has a predetermined length, the workpieces are arrange at predetermined pitches in a processing region in the processing vessel, an oxidative gas and a reductive gas are supplied into the processing vessel so as to flow from one end of opposite ends of the processing vessel toward the other end of the processing vessel in the step of producing active hydroxyl and active oxygen species.

In the oxidation method according to the present invention, parts of the processing vessel through which the oxidative gas and the reductive gas are supplied into the processing vessel are positioned a predetermined distance apart from the processing region of the workpieces in the processing vessel.

In the oxidation method according to the present invention, the predetermined distance is determined such that the oxidative gas and the reductive gas do not affect adversely temperature distribution in the processing region of the workpieces and the oxidative gas and the reductive gas supplied into the processing vessel can be satisfactorily mixed.

The separation of the parts of the processing vessel through which the oxidative gas and the reductive gas are supplied into the processing vessel from the processing region by the predetermined distance prevents the oxidative gas and the reductive gas from adversely affecting temperature distribution in the processing region in which the workpieces are processed and enables the satisfactory mixing of the oxidative gas and the reductive gas.

In the oxidation method according to the present invention, the predetermined distance is about 100 mm or above.

In the oxidation method according to the present invention, the oxidative gas contains one or some of $O_2$, $N_2O$, NO and $NO_2$, and the reductive gas contains one or some of $H_2$, $NH_3$, $CH_4$ and HCl.

Both the intrafilm thickness uniformity and the characteristics of the oxide film can be improved, maintaining oxidation rate on a relatively high level.

In the oxidation method according to the present invention, the pressure in the vacuum atmosphere is below 133 Pa (1 Torr).

In the oxidation method according to the present invention, the pressure in the vacuum atmosphere is in the range of 6.7 to 67 Pa (0.05 to 0.5 Torr).

In the oxidation method according to the present invention, the predetermined temperature is in the range of 400 to 1100° C.

In the oxidation method according to the present invention, an additional oxidative gas and an additional reductive gas are supplied additionally into the processing vessel so as to flow in an opposite direction of the main oxidation gas and the main reductive gas in the step of producing active hydroxyl and active oxygen species.

An oxidation system according to the present invention comprises: a processing vessel for containing workpieces; a support means for supporting workpieces in a processing region in the processing vessel; a heating means for heating workpieces; an evacuation system for evacuating the processing vessel; an oxidative gas supply system for supplying an oxidative gas into the processing vessel; and a reductive gas supply system separate from the oxidative gas supply system, for supplying a reductive gas into the processing vessel to produce active hydroxyl and active oxygen species by the interaction of the oxidative gas and the reductive gas; wherein surfaces of workpieces placed in the processing region are oxidized by the active hydroxyl and the active oxygen species.

In the oxidation system according to the present invention, the oxidative gas supply system and the reductive gas supply system are connected to one end of the processing vessel to make the oxidative gas and the reductive gas flow toward the other end of the processing vessel.

In the oxidation system according to the present invention, the heating means heats both the oxidative gas and the reductive gas.

In the oxidation system according to the present invention, the oxidative gas supply system has an oxidative gas supply nozzle, the reductive gas supply system has a reductive gas supply nozzle, the oxidative gas supply nozzle and the reductive gas supply nozzle have outlets positioned a predetermined distance apart from the processing region of the workpieces.

In the oxidation system according to the present invention, the predetermined distance is determined such that the oxidative gas and the reductive gas do not affect adversely temperature distribution in the processing region of the workpieces and the oxidative gas and the reductive gas can be satisfactorily mixed.

The separation of the outlets of the oxidative gas supply nozzle and the reductive gas supply nozzle from the processing region by the predetermined distance prevents the oxidative gas and the reductive gas from adversely affecting temperature distribution in the processing region in which the workpieces are processed and enables the satisfactory mixing of the oxidative gas and the reductive gas.

In the oxidation system according to the present invention, the predetermined distance is about 100 mm or above.

In the oxidation system according to the present invention, the oxidative gas supply system has an oxidative gas supply nozzle, the reductive gas supply system has a reductive gas supply nozzle, and both the nozzles extend from one of the opposite ends of the processing vessel toward the other end of the processing vessel and have gas outlets positioned at the other end of the processing vessel In the oxidation system according to the present invention, the oxidative gas contains one or some of $O_2$, $N_2O$, NO and $NO_2$, and the reductive gas contains one or some of $H_2$, $NH_3$, $CH_4$ and HCl.

In the oxidation system according to the present invention, the oxidative gas supply system has a supplementary oxidative gas supply nozzle, the reductive gas supply system has a supplementary reductive gas supply nozzle, and the supplementary oxidative gas supply nozzle and the supplementary reductive gas supply nozzle have gas outlets disposed at one end of the processing vessel.

BRIEF DESCRIPTION OF THE DRAWINGS

FIG. 1 is a schematic view of an example of an oxidation system that carries out a film forming method in a preferred embodiment according to the present invention;

FIG. 5 is a graph showing the dependence of the thickness and intrafilm thickness uniformity of oxide films on process pressure;

FIG. 6 is a graph showing thicknesses of oxide films in a pressure range including pressures below the pressures shown in FIG. 5;

BEST MODE FOR CARRYING OUT THE INVENTION

Figure 2:
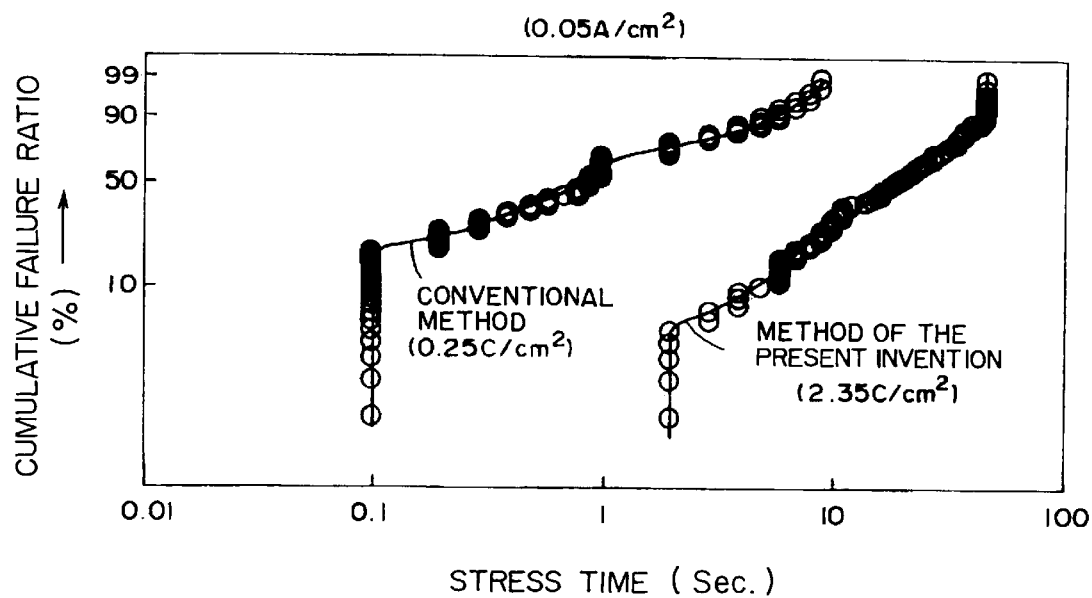
FIG. 2 is a graph showing the failure ratio of $SiO_2$ films formed by an oxidation method according to the present invention and a conventional oxidation method (dry oxidation method)

An oxidation method and an oxidation system in preferred embodiments according to the present invention will be described hereinafter with reference to the accompanying drawings.

FIG. 1 shows an example of an oxidation system 2 that carries out a film forming method in a preferred embodiment according to the present invention. In the following description, it is assumed that an oxidative gas is oxygen gas ($O_2$) and a reductive gas is hydrogen gas ($H_2$).

The oxidation system 2 has a double-wall vertical processing vessel 8 of a predetermined length including an inner tube 4 and an outer tube 6. Both the inner tube 4 and the outer tube 6 are made of quartz. A quartz wafer boat 10, i.e., a support means for holding workpieces, is placed in a processing space S in the inner tube 4. A plurality of semiconductor wafers W are held in layers at predetermined pitches on the wafer boat 10. The pitches are equal for some cases and are different for other cases.

A cap 12 covers the open lower end of the processing vessel 8, and a shaft 16 is extended through the cap 12. The gap between the cap 12 and the shaft 16 is sealed by a magnetic fluid seal 14, and a rotary table 18 is attached to the upper end of the shaft 16. A heat insulating tube 20 is placed on the rotary table 18 and the wafer boat 10 is mounted on the heat insulating tube 20. The shaft 16 is supported on an arm 24 included in a vertically movable boat elevator 22. The shaft 16 can be moved vertically together with the cap 12 and the wafer boat 10. The wafer boat 10 can be inserted in and taken out of the processing vessel 8 through the lower end of the processing vessel 8. The wafer boat 10 does not need necessarily to be rotated and may be held stationary.

A manifold 26 made of, for example, a stainless steel is joined to the open lower end of the processing vessel 8. An oxidative gas supply system 28 for supplying an oxidative gas at a controlled flow rate and a reductive gas supply system 30 for supplying a reductive gas at a controlled flow rate are connected individually to the manifold 26.

The oxidative gas supply system 28 includes an oxidative gas supply nozzle 32 penetrating the manifold, and a gas supply line 36 connected to the oxidative gas supply nozzle 32 and provided with a flow controller 34, such as a mass flow controller. An oxidative gas source 30 storing an oxidative gas, such as oxygen gas in this embodiment, is connected to the gas supply line 36.

The reductive gas supply system 30 includes a reductive gas supply nozzle 40 penetrating the manifold 26, and a gas supply line 44 connected to the reductive gas supply nozzle 40 and provided with a flow controller 42, such as a mass flow controller. A reductive gas source 46 storing a reductive gas, such as hydrogen gas in this embodiment, is connected to the gas supply line 44.

The gas supply nozzles 32 and 40 have gas outlets 32a and 40a, respectively. The gas outlets 32a and 40a are formed in the manifold 26 disposed at one end of the processing vessel 8.

The gases supplied through the gas outlets 32a and 40a of the gas supply nozzles 32 and 40 flow from one end to the other end of the processing vessel 8. That is, the gases flow upward in the processing space S, i.e., a wafer processing region, in the inner tube 4, start flowing down from a top of the processing vessel 8, flow down through an space between the inner tube 4 and the outer tube 6 and flow out of the processing vessel 8. An exhaust port 50 is formed in a lower part of the side wall of the outer tube 6. An evacuating system 56 including an exhaust line 52 and a vacuum pump 54 connected to the exhaust line 52 is connected to the exhaust port 50 to evacuate the processing vessel 8. The processing space S, i.e., a wafer processing region, is positioned a predetermined distance H1 apart from the position of a gas supply position. More concretely, the lower end of the processing space S corresponding to the lower end of the wafer boat 10 is positioned a predetermined distance H1 apart from the positions of the respective gas outlets 32a and 40a of the nozzles 32 and 40. A first purpose of the distance H1 is to preheat the gases by heat radiated by the hot wall of the processing vessel 8 heated by a heater 62 while the gases flow upward through the distance H1. Generally, the processing space S extending along the wafer boat 10 is maintained accurately at a fixed temperature. If gases of, for example, a room temperature is supplied to a region in the vicinity of a lower end part of the wafer boat 10, the temperature of the same region will drop, adversely affecting temperature distribution in the processing space. A second purpose of the distance H1 is to enable the gases to mix uniformly while the gases flow upward through the distance H1.

The distance H1 is determined such that the oxidative gas and the reductive gas supplied into the processing space S do not affect adversely to temperature distribution in the processing space S, and mix uniformly. The distance H1 is, for example 100 mm or above, preferably, 300 mm or above. In this embodiment, the distance H1 is about 350 mm. A heat insulating member 60 is disposed so as to surround the processing vessel 8, and the heater 62, i.e., a heating means, is attached to the inner circumference of the heat insulating member 60 to heat wafers W placed in the processing space S at a predetermined temperature.

When, for example, about 150 wafers W of 8 in. diameter (about 130 wafers and about 20 dummy wafers) supported on the wafer boat 10 are processed in a batch, the inner tube 4 of the processing vessel 8 is about 260 to about 270 mm in diameter, the outer tube 6 is about 275 to about 285 mm in diameter and the processing vessel 8 is about 1280 mm in height.

When about 25 to 50 wafers W of 12 in. diameter supported on the wafer boat 10 are processed in a batch the inner tube 4 is about 380 to about 420 mm, the outer tube 6 is about 440 to about 500 mm in diameter and the processing vessel is about 800 mm in height. The height of the wafer boat 10 is equal to the height H2 of the processing space S2 in which the wafers are placed for processing. The height H2 is dependent on the number of wafers to be processed in a batch and is, for example, in the range of about 200 to about 1000 mm. Those numerical values are given only by way of example.

Shown in FIG. 1 are a sealing member 64, such as an O ring, for sealing the gap between the cap 12 and the manifold 26, a sealing member 66, such as an O ring, for sealing the gap between the manifold 26 and the lower end of the outer tube 6.

An oxidizing method according to the present invention to be carried out by the aforesaid oxidation system will be described.

A plurality of semiconductor wafers W are supported in layers at predetermined pitches on the wafer boat 10. The boat elevator 22 is moved upward to insert the wafer boat 10 through the lower end of the processing vessel 8 in the processing vessel 8 and the processing vessel 8 is sealed hermetically. The processing vessel 8 is heated beforehand. Films to be oxidized, such as single crystal films, polysilicon films or metal oxide films, have already formed on surfaces of the semiconductor wafers W, respectively, by the preceding process. In some cases, surfaces of single-crystal wafers are oxidized.

After the wafers W have been loaded into the processing vessel 8, power supplied to the heater 62 is increased to heat the wafers W at a predetermined processing temperature and the processing vessel 8 is evacuated by the evacuating system 56.

At the same time, the oxidative gas supply system 28 supplies oxygen gas at a controlled flow rate through the gas outlet 32a of the oxidative gas supply nozzle 32 and the reductive gas supply system 30 supplies hydrogen gas at a controlled flow rate through the gas outlet 40a of the reductive gas supply nozzle 40 into the processing vessel 8.

The oxygen gas and the hydrogen gas separately supplied into the processing vessel 8 flow upward in the processing vessel 8, while producing active hydroxyl species and active oxygen species to oxidize surfaces of the wafers W. When oxidizing single-crystal silicon films or polysilicon films, the temperature of the wafers W is in the range of 400 to 1100° C., preferably, in the range of 400 to 900° C. taking into consideration the heat resistance of the wafers is taken into consideration, the pressure in the processing vessel 8 is 133 Pa (1 Torr) or below, preferably, in the range of 6.7 Pa (0.05 Torr) to 67 Pa (0.5 Torr) taking into consideration concentration distribution. Oxygen gas flow rate is in the range of 1 sccm to 10 slm and oxygen gas flow rate is in the range of 1 sccm to 5 slm.

Thus, oxidation rate is maintained on a relatively high level and the intrafilm thickness uniformity and the quality of an oxide film on each wafer W can be improved greatly. Uniformity of plurality of wafers W in film quality can be also improved.

When oxygen gas and hydrogen gas are supplied separately into a vacuum atmosphere of the processing vessel 8, it is considered that the hydrogen gas undergoes the following combustion reactions, in which chemical symbols with asterisk (*) indicates an active specie of a substance indicated by the chemical symbol.

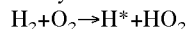
$H_2+O_2 \rightarrow H^*+HO_2$
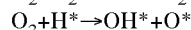
$O_2+H^* \rightarrow OH^*+O^*$
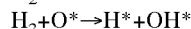
$H_2+O^* \rightarrow H^*+OH^*$
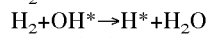
$H_2+OH^* \rightarrow H^*+H_2O$ When hydrogen gas ($H_2$) and oxygen gas ($O_2$) are supplied separately into the processing vessel 8, active oxygen species ($O^*$), active hydroxyl species ($OH^*$) and steam ($H_2O$) are produced by the burning of hydrogen gas. It is inferred that $O^*$ and $OH^*$ contributes greatly to the improvement of he film quality and the intrafilm thickness uniformity of the oxide film. That is, since the oxidation process is carried out in a vacuum atmosphere of a pressure which is far below a process pressure of the conventional oxidation method, the aforesaid reactions represented by the chemical formulas proceeds gradually while oxygen gas and hydrogen gas flows upward in the processing vessel 8, proper amounts of $H_2O$, $O^*$ (active oxygen species) and $OH^*$ (active hydroxyl species) are supplied to all the wafers W regardless of the height of the wafers W. Consequently, all the wafers W are subjected uniformly to the oxidation process regardless of the height thereof and the film thickness uniformity of the oxide films formed on the wafers w can be improved. It is considered that active oxygen species and active hydroxyl species contribute greatly to the oxidation of the wafers W and the life of the active oxygen species and active hydroxyl species is extended by carrying out the oxidation method in the vacuum atmosphere of a process pressure considerably lower than that at which the conventional oxidation method is carried out. Therefore, the active species do not become very extinct and active species concentration in the processing space S is maintained in a substantially uniform manner while the active species flow upward through the processing space S of the height H2 contributing to the oxidation reaction. Consequently, the thickness uniformity of films respectively formed on the wafers W placed at different heights can be improved.

Moreover, since the life of the oxygen and hydrogen species is extended, active species concentration distribution over the surface of each wafer W, from the periphery edge to the center thereof, is uniform and hence the intrafilm thickness uniformity and the characteristics of the oxide film can be improved greatly.

Since oxygen gas and hydrogen gas are supplied into the position which is located distance H1 apart from the lower end of the processing space S instead of supplying the same directly into the processing space S, the gases mix satisfactorily and are preheated by the heat radiated by the hot wall of the processing vessel 8 heated by the heater 62 while the same flow through the distance H1, which promotes the activation of the gases.

Silicon films were oxidized by the oxidation method of the present invention and a conventional dry oxidation method to form silicon dioxide films ($SiO_2$ films) and the characteristics of the silicon dioxide films were examined. The results of the examination will be explained.

FIG. 2 shows the failure ratio of $SiO_2$ films formed by the oxidation method of the present invention and the conventional dry oxidation method. Time that was necessary to cause 90% of the $SiO_2$ films to break down by forcibly passing a current of 0.05 A/cm² through each $SiO_2$ films was measured.

As is obvious from FIG. 2, whereas 90% of the $SiO_2$ films formed by the conventional wet oxidation method broke down in about 6 s, time necessary to cause 90% of the $SiO_2$ films formed by the oxidation method of the present invention broke down was as long as about 50 s, which proved the excellent dielectric strength and reliability and satisfactory quality of the $SiO_2$ films formed by the oxidation method of the present invention. A total amounts of charge that was necessary to cause 90% of the $SiO_2$ films formed by the conventional wet oxidation method and the $SiO_2$ films formed by the oxidation method of the present invention broke down were 0.25 C/cm² and 2.35 C/cm² respectively.

Silicon films were oxidized by the oxidation method of the present invention and a conventional external combustion type atmospheric wet oxidation method to form silicon dioxide films ($SiO_2$ films) and the intrafilm thickness uniformity of the $SiO_2$ films were examined. The results of the examination will be explained.

Figure 3:
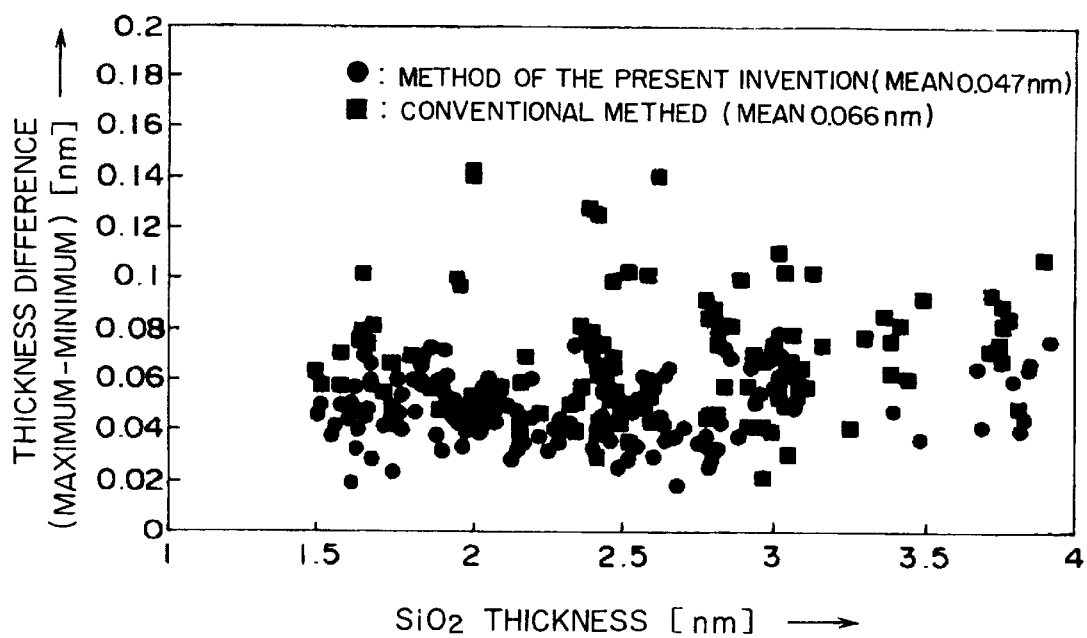
FIG. 3 is a graph showing the distribution of film thickness differences each between a maximum thickness and a minimum thicknesses of each of $SiO_2$ films formed by an oxidation method according to the present invention and those each between a maximum thickness and a minimum thickness of each of $SiO_2$ films formed by a conventional oxidation method (external combustion type atmospheric wet oxidation method)

FIG. 3 is a graph showing the distribution of film thickness differences, each between a maximum thickness and a minimum thickness of each of $SiO_2$ films formed by the oxidation method of the present invention, and those, each between a maximum thickness and a minimum thickness of each of $SiO_2$ films formed by the conventional external combustion type atmospheric wet oxidation method. Process conditions for the oxidation method of the present invention were 850° C. in process temperature, 26.6 Pa (0.2 Torr) in process pressure, 0.1 slm in $O_2$ gas flow rate and 0.2 slm in $H_2$ gas flow rate. Process conditions for the conventional oxidation method were 850° C. in process temperature, 95760 Pa (720 Torr) in process pressure, 0.6 slm in $O_2$ gas flow rate, 0.6 slm in $H_2$ gas flow rate and 20 slm in $N_2$ gas flow rate. The surfaces of wafers were oxidized to form oxide films respectively having thicknesses in the range of 1 to 4 nm.

As is obvious from the graph shown in FIG. 3, whereas the thickness difference of the oxide films on each wafer formed by the conventional oxidation method is distributed in a wide range regardless of the thickness of the oxide film, the thickness difference of the oxide film on each wafer formed by the oxidation method of the present invention is distributed in a narrow range. Thus the intrafilm thickness differences of the oxidation films formed by the oxidation method of the present invention are considerably small. The mean thickness difference of the oxide films formed by the conventional oxidation method was 0.066 nm and that of the oxide films formed by the oxidation method of the present invention was 0.047 nm, which proved that the oxidation method of the present invention improves the intrafilm thickness uniformity greatly.

Oxidation rate of the oxidation method of the present invention and that of a conventional oxidation method that supplies steam directly into the processing vessel were examined.

Figure 4:
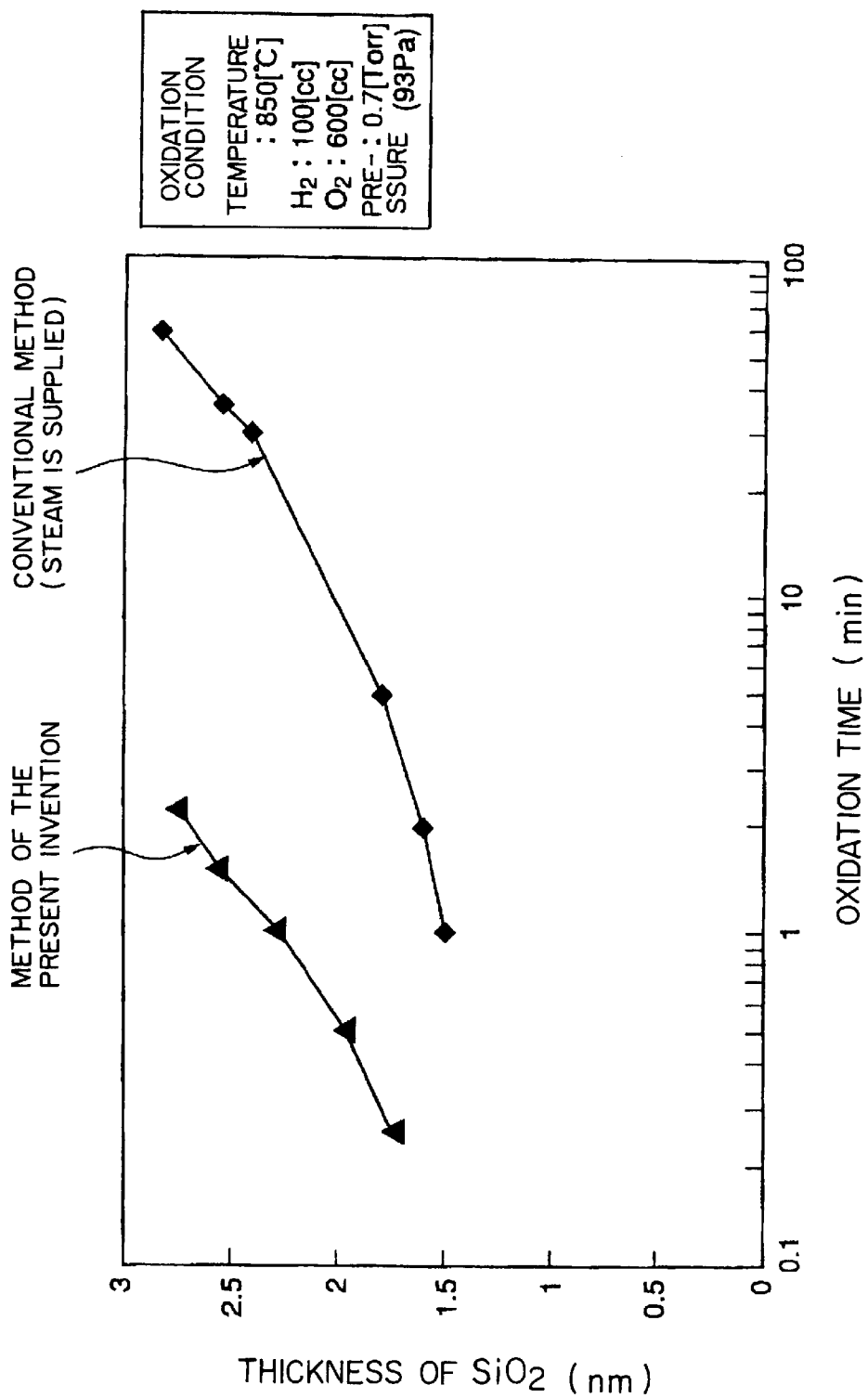
FIG. 4 is a graph showing the variation of the thickness of oxide films with oxidation time.

FIG. 4 is a graph showing the relation between oxidation time and the thickness of oxide films. Process conditions were 850° C. in process temperature, 93 Pa (0.7 Torr) is process pressure, 100 sccm in $H_2$ gas flow rate and 600 sccm in $O_2$ gas flow rate.

As is obvious from The graph shown in FIG. 4, the thickness of an oxide film formed by the oxidation method of the present invention is ten times or above that of an oxide film formed by the conventional oxidation method in the same time; that is, the oxidation rate of the oxidation method of the present invention is ten times or above that of the conventional oxidation method, and hence the oxidation method of the present invention increases the throughput of the oxidation process accordingly.

The dependence of the thickness of oxide films on process pressure was examined. The result of the examination will be explained.

FIG. 5 is a graph showing the dependence of the thickness and intrafilm thickness uniformity of oxide films formed on the wafer which is located at the same position in the same batch, on process pressure. FIG. 6 is a graph showing the dependence of the thickness of oxide films, on process pressure in a pressure range including pressures below the pressures shown in FIG. 5. In FIG. 5, values indicating interfilm thickness uniformity of different wafers W are written along with curves indicating the thicknesses of oxide films. In the graphs shown in FIGS. 5 and 6, TOP, CTR and BTM indicate wafers placed at upper, middle and lower positions, respectively, on the wafer boat 10. Process conditions for forming the oxide films shown in FIGS. 5 and 6(A) are 900° C. in process temperature, 600 sccm in $H_2$ gas flow rate, 1200 sccm in $O_2$ gas flow rate and 60 min in processing time. Process conditions for forming the oxide films shown in FIG. 6(B) are 850° C. in process temperature, 50 sccm in $H_2$ gas flow rate, 100 sccm in $O_2$ gas flow rate and 3 min in processing time.

As is obvious from FIG. 5, the lower the process pressure is, the better both the intrafilm thickness uniformity and the interfilm thickness uniformity. It was found that the process pressure must be below 133 Pa (1 Torr) to reduce the intrafilm thickness uniformity to an appropriate value, such as about ±0.8%, that is expected to be achieved by the future oxidation processes.

FIG. 6(A) is a graph showing, for confirming the reproducibility of the oxidation method, the dependence of the thickness of oxide films formed under the same process conditions as those mentioned in the foregoing description made in connection with FIG. 5, on process pressure, except that process conditions for forming the oxide films shown in FIG. 6(A) include a process pressure of 67 Pa (0.5 Torr). It is known from the comparative examination of the graphs shown in FIGS. 5 and 6(A) that modes of variation of the thickness of the oxide film with process pressure in FIGS. 5 and 6(A) are substantially the same except for a process condition of a process pressure of 67 Pa, which proves excellent reproducibility of the oxidation method. FIGS. 5 and 6(A) show the variation of the thickness on the order of 12 nm of the oxide films with process pressure. FIG. 6(B) is a graph showing the variation of the thickness of oxide films with process pressure in a process pressure range not higher than 67 Pa (0.5 Torr).

Process conditions shown in FIG. 6(B) are for forming oxide films of a desired thickness of 2 nm, which is 1/6 of a desired thickness of 12 nm for the oxide films formed under the process conditions shown in FIGS. 5 and 6(A). As is obvious from FIG. 6(B), the thicknesses of the oxide films are on the order of 2 nm for the process pressure range of 6.7 Pa (0.05 Torr) to 67 Pa (0.5 Torr) and the thicknesses of the oxide films formed on TOP, CTR and BTM are scarcely different from each other.

It is known from FIG. 6(B) that the oxide films can be formed in satisfactory thickness uniformity even if the oxide films are as thin as 2 nm. It is also known from FIG. 6(B) that the thickness uniformity can be maintained on a high level in the process pressure range of 6.7 Pa (0.05 Torr) to 67 Pa (0.5 Torr).

It is considered that intrafilm thickness uniformity and interfilm thickness uniformity can be improved when the process pressure is in the low process pressure range because the life of active oxygen species and active hydrogen species produced in the processing vessel 8 is extended sufficiently when the process pressure is very low. Thus, when active oxygen species and active hydrogen species flow through the processing space S, active species concentration distributions can be uniform throughout the processing space S.

Oxidation rate can be properly changed and controlled by changing the flow rate ratio between $H_2$ gas and $O_2$ gas or by properly mixing an inert gas, such as nitrogen gas, argon gas or helium gas, into $H_2$ gas and $O_2$ gas.

Figure 7:
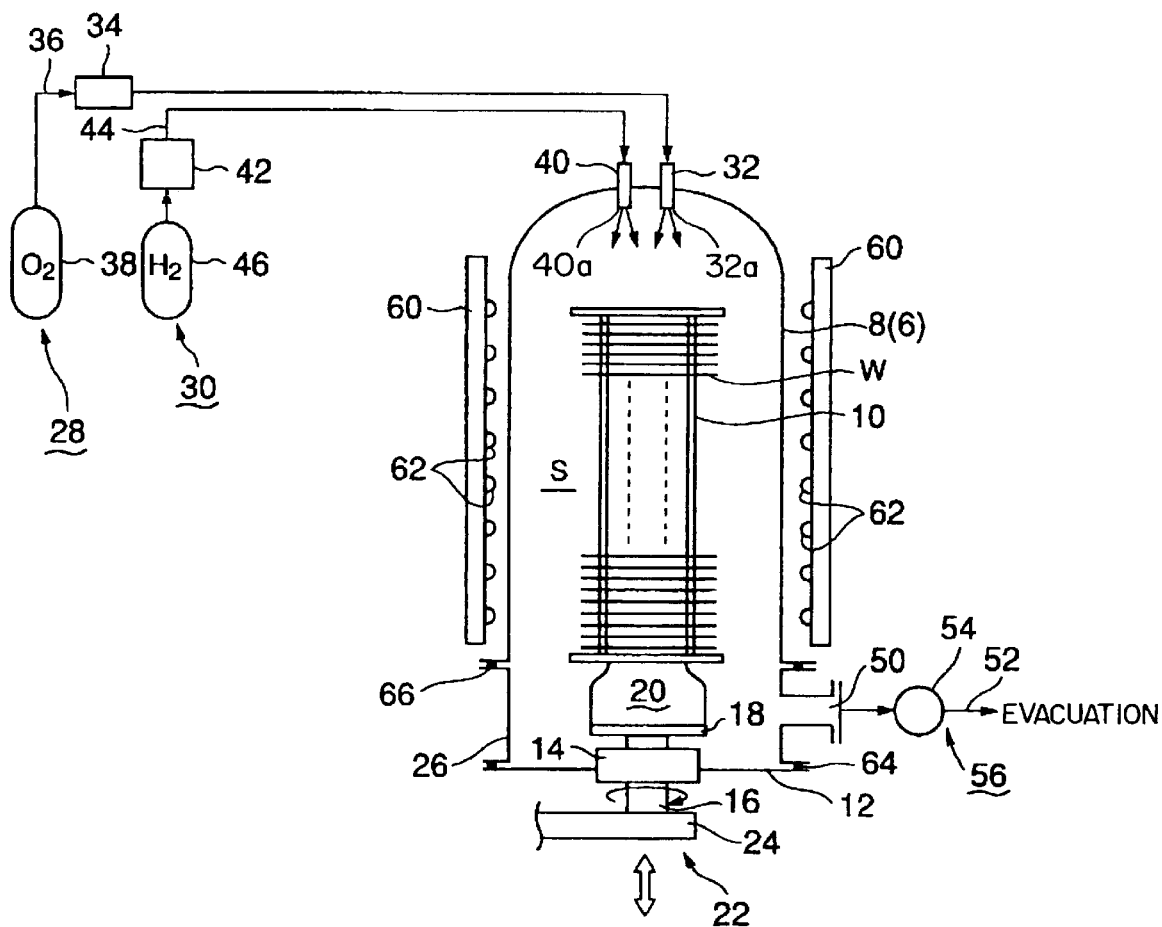
FIG. 7 is a schematic view of a oxidation system of single-tube structure.

Although the present invention has been described as applied to the oxidation system provided with the processing vessel 8 of double-wall construction, the present invention is applicable also to a processing system provided with a processing vessel of single-wall construction. In the processing system provided with the processing vessel of single-wall construction, gases may be supplied into the processing vessel so as to flow from the upper end of the processing vessel toward the lower end of the processing vessel as shown in FIG. 7. An oxidation system provided with a processing vessel of a single-wall construction will be described by way of example with reference to FIG. 7, in which parts like or corresponding to those shown in FIG. 1 are denoted by the same reference characters and the description thereof will be omitted.

The oxidation system shown in FIG. 7 is provided with a processing vessel 8 of single-wall construction provided only with an outer tube 6 and not provided with any member corresponding to the inner tube 4 shown in FIG. 1. An exhaust port 50 is formed in a manifold 26. An oxidative gas supply system 28 has an oxidative gas supply nozzle 32 attached to a top part of the processing vessel 8 and a reductive gas supply system 30 has a reductive gas supply nozzle 40 attached to the top part of the processing vessel 8. $O_2$ gas and $H_2$ gas are supplied through the respective gas outlets 32a and 40a of the nozzles 32 and 40, respectively, into the processing vessel 8, and flow down through the processing vessel 8. The $H_2$ gas is burnt to oxidize wafers W and the gases are discharged through the exhaust port 50 by suction.

Figure 8:
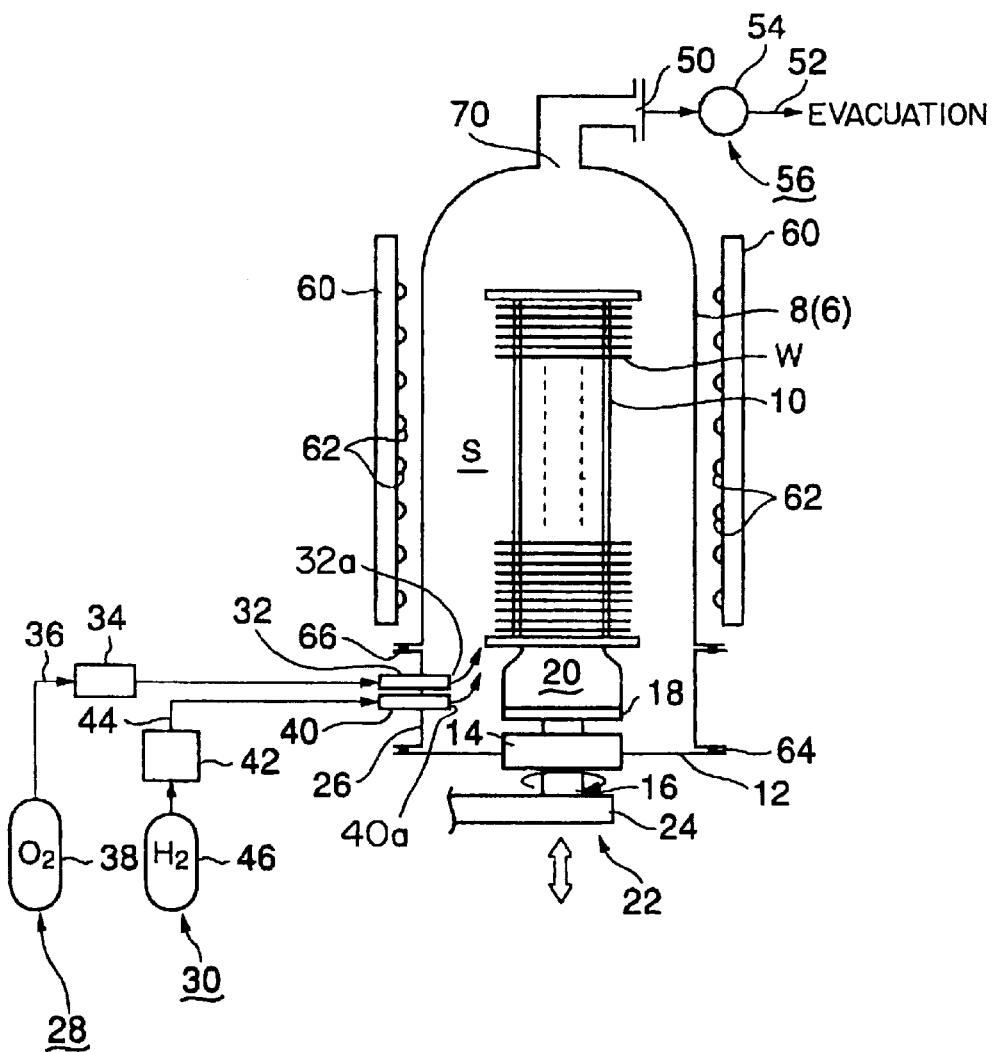
FIG. 8 is a schematic view of another oxidation system of single-tube structure.

An oxidation system as shown in FIG. 8 may be used. The oxidation system shown in FIG. 8 is provided with a processing vessel 8 of single-wall construction. An exhaust port 70 is formed in a top part of the processing vessel 8. An oxidative gas and a reductive gas may be supplied into the processing vessel 8 through the gas outlets 32a and 40a of nozzles 32 and 40 attached to a lower part of the processing vessel 8, respectively.

Figure 9:
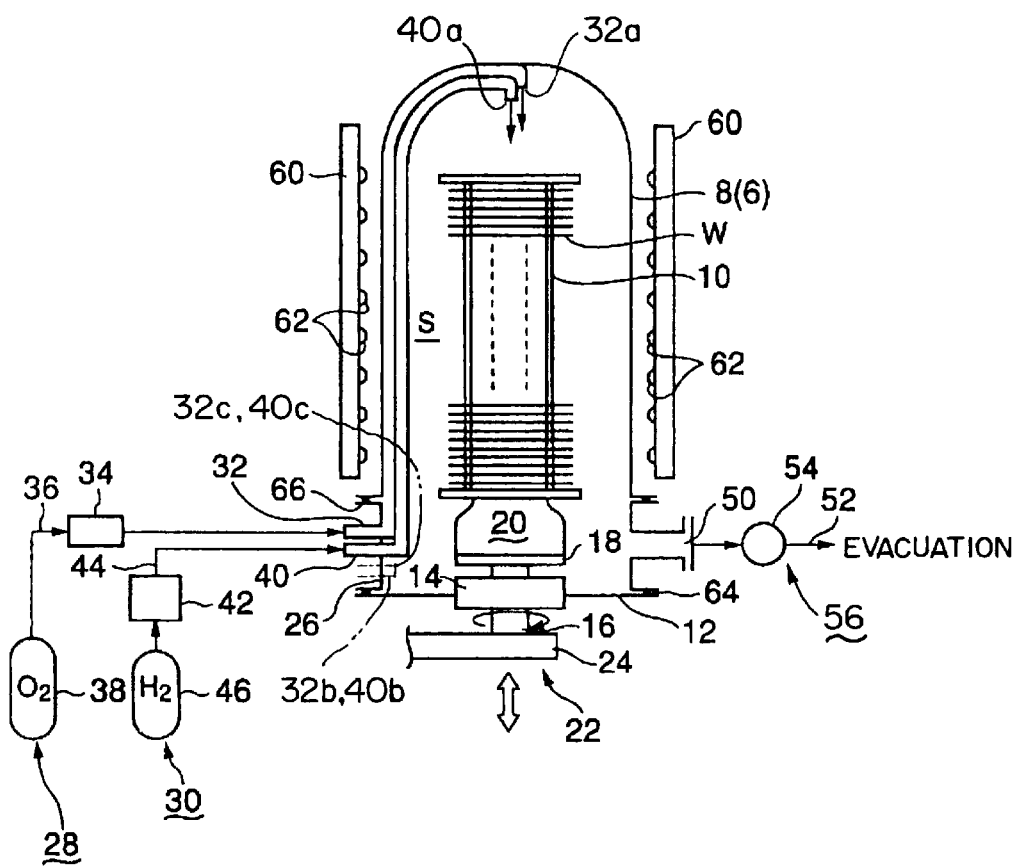
FIG. 9 is a schematic view of a third oxidation system of single-tube structure.

An oxidation system as shown in FIG. 9 may be used. The oxidation system shown in FIG. 9 is provided with a processing vessel 8 of a single-wall construction. A manifold 26 is joined to the lower end of the processing vessel 8. Nozzles 32 and 40 extend through the manifold 26 and along the inner surface of the processing vessel 8 to the upper end of the processing vessel 8 so that the gas outlets 32a and 40a thereof are positioned in a top part of the processing vessel. 8. $O_2$ gas and $H_2$ gas are supplied through the gas outlets 32a and 40a into the processing vessel 8. The gases are activated as the same flow down through the processing vessel 8 and are discharged through an exhaust port 50 formed in a lower part of the processing vessel 8.

In this embodiment, the gases are preheated sufficiently by heat radiated by a heater 62 and heat radiated by the wall of the processing vessel 8 heated by the heater 62 while the same flow through the nozzles 32 and 43 extended along the side wall of the processing vessel 8. Thus active species of those gases can be more efficiently produced.

The oxidation system shown in FIG. 9 may be provided with an additional oxidative gas supply nozzle 32b and an additional reductive gas supply nozzle 40b connected to the manifold 26 so that the gas outlets 32c and 40c thereof opens into a lower end region of a processing space in the processing vessel 8. An additional oxidative gas and an additional reductive gas can be additionally supplied into the processing vessel 8 through the additional oxidative gas supply nozzle 32b and the additional reductive gas supply nozzle 40b.

The additional oxidative gas and the additional reductive gas from the gas outlet 32c and 40c flow in an opposite direction of the main oxidative gas and the main reductive gas from the gas outlets 32a and 40a.

Although the aforesaid embodiment uses $O_2$ gas as an oxidative gas and uses $H_2$ gas as a reductive gas, the oxidative gas may be one or some of $O_2$, $N_2O$, NO and $NO_2$, and the reductive gas may be one or some of $H_2$, $NH_3$, $CH_4$ and HCl.

Principally, active oxygen species and active hydroxyl species produced by the burning of the reductive gas contribute to an oxidation reaction that occurs on the surfaces of the wafers. When gases other than $O_2$ gas and $H_2$ gas are used, process conditions including the temperature of the wafers and process pressure may be similar to those when oxygen gas and hydrogen gas are used.

The oxidation method according to the present invention is applicable not only to the foregoing batch-processing oxidation system capable of oxidizing a plurality of wafers in a batch, but also to a single-wafer processing oxidation system that supports a semiconductor wafer on a stage (support means) placed in a processing vessel and processes the single wafer for oxidation by heating the semiconductor wafer by a heating means, such as lamps of a heater.

The workpieces are not limited to semiconductor wafers and may be substrates for LCDs and glass substrates.

As apparent from the foregoing description, the oxidation method and the oxidation system according to the present invention exercise the following excellent effects.

Intrafilm uniformity, interfilm uniformity and film quality of oxide films can be improved maintaining oxidation rate on a relatively high level.

What is claimed is:

1. An oxidation method of oxidizing surfaces of workpieces heated at a predetermined temperature in a vacuum atmosphere within a processing vessel, said oxidation method comprising the steps of:

producing active hydroxyl and active oxygen species in the processing vessel; and oxidizing the surfaces of the workpieces by the active hydroxyl and the active oxygen species wherein an oxidative gas and a reductive gas are supplied into the processing vessel by separate gas supply systems, respectively, in the step of producing active hydroxyl and active oxygen species.

2. The oxidation method according to claim 1, wherein the processing vessel has a predetermined length, the workpieces are arranged at predetermined pitches in a processing region in the processing vessel, an oxidative gas and a reductive gas are supplied into the processing vessel so as to flow from one of opposite ends of the processing vessel toward the other of opposite ends in the step of producing active hydroxyl and active oxygen species.

3. The oxidation method according to claim 2, wherein parts of the processing vessel through which the oxidative gas and the reductive gas are supplied into the processing vessel are positioned a predetermined distance apart from the processing region of the workpieces in the processing vessel.

4. The oxidation method according to claim 3, wherein the predetermined distance is determined such that the oxidative gas and the reductive gas do not affect adversely temperature distribution in the processing region of the workpieces and the oxidative gas and the reductive gas supplied into the processing vessel can be satisfactorily mixed.

5. The oxidation method according to claim 4, wherein the predetermined distance is about 100 mm or above.

6. The oxidation method according to claim 2, wherein an additional oxidative gas and an additional reductive gas are supplied additionally into the processing vessel so as to flow in an opposite direction of the oxidative gas and the reductive gas flowing from one end toward the other end in the step of producing active hydroxyl and active oxygen species.

7. The oxidation method according to claim 1, wherein the oxidative gas contains one or some of $O_2$, $N_2O$, NO and $NO_2$, and the reductive gas contains one or some of $H_2$, $NH_3$, $CH_4$ and HCl.

8. The oxidation method according to claim 1, wherein the pressure of the vacuum atmosphere is below 133 Pa (1 Torr).

9. The oxidation method according to claim 8, wherein the pressure of the vacuum atmosphere is in the range of 6.7 to 67 Pa (0.05 to 0.5 Torr).

10. The oxidation method according to claim 1, wherein the predetermined temperature is in the range of 400 to 1100° C.

* * * * *